(12) United States Patent
Conner et al.

(10) Patent No.: US 8,100,583 B2
(45) Date of Patent: Jan. 24, 2012

(54) THERMOCOUPLE

(75) Inventors: Rand Conner, Chandler, AZ (US);
Ravinder K. Aggarwal, Gilbert, AZ (US)

(73) Assignee: ASM America, Inc., Phoenix, AZ (US)

( * ) Notice: Subject to any disclaimer, the term of this patent is extended or adjusted under 35 U.S.C. 154(b) by 393 days.

(21) Appl. No.: 12/436,315

(22) Filed: May 6, 2009

(65) Prior Publication Data

US 2010/0284438 A1  Nov. 11, 2010

(51) Int. Cl.
*G01K 7/02* (2006.01)
*G01K 1/00* (2006.01)
*H01L 35/02* (2006.01)

(52) U.S. Cl. ............... 374/179; 374/208; 374/E7.004; 136/230

(58) Field of Classification Search .............. 374/179, 374/208, 141, E7.004–E7.006, E7.012, E13.001, 374/E1.011, E1.018, E1.02; 136/230
See application file for complete search history.

(56) References Cited

U.S. PATENT DOCUMENTS

| | | | |
|---|---|---|---|
| 154,695 A | 9/1874 | Manly | |
| 2,059,480 A | 11/1936 | Obermaier | |
| 2,266,416 A | 12/1941 | Duclos | |
| 2,563,931 A | 8/1951 | Harrison | |
| 2,660,061 A | 11/1953 | Lewis | |
| 3,011,006 A | 11/1961 | Nicholson | |
| 3,038,951 A | 6/1962 | Mead | |
| 3,263,502 A | 8/1966 | Springfield | |
| 3,588,192 A | 6/1971 | Drutchas et al. | |
| 3,913,058 A | 10/1975 | Nishio et al. | |
| 4,093,491 A | 6/1978 | Whelpton et al. | |
| 4,217,463 A | 8/1980 | Swearingen | |
| 4,234,449 A | 11/1980 | Wolson et al. | |
| 4,355,912 A | 10/1982 | Haak | |
| 4,377,347 A | 3/1983 | Hanmyo et al. | |
| 4,444,990 A | 4/1984 | Villar | |
| 4,454,370 A | 6/1984 | Voznick | |
| 4,527,005 A | 7/1985 | Mckelvey | |
| 4,592,307 A | 6/1986 | Jolly | |
| 4,692,556 A | 9/1987 | Bollen et al. | |
| 4,721,533 A | 1/1988 | Phillippi et al. | |
| 4,721,534 A | 1/1988 | Phillippi et al. | |
| 4,749,416 A | 6/1988 | Greenspan | |
| 4,830,515 A | 5/1989 | Cortes | |
| 4,934,831 A | 6/1990 | Volbrecht | |

(Continued)

FOREIGN PATENT DOCUMENTS

EP    0229488    7/1987

(Continued)

OTHER PUBLICATIONS

International Search Report and Written Opinion for Application No. PCT/US2010/033252 dated Jan. 28, 2011.

(Continued)

*Primary Examiner* — Amy Cohen Johnson
(74) *Attorney, Agent, or Firm* — Snell & Wilmer L.L.P.

(57) ABSTRACT

A thermocouple having at least one inner alignment feature or at least one outer alignment feature, or a combination thereof for positively positioning and aligning at least one thermocouple junction within a bore formed in a susceptor ring of a semiconductor substrate processing reactor. The outer alignment feature is configured to positively align the junction(s) longitudinally within the bore. The inner alignment feature configured to positively position the junction(s) rotationally within the sheath of the thermocouple relative to the bore.

15 Claims, 7 Drawing Sheets

U.S. PATENT DOCUMENTS

| | | | |
|---|---|---|---|
| 4,976,996 A | 12/1990 | Monkowski et al. | |
| 4,978,567 A | 12/1990 | Miller | |
| 4,984,904 A | 1/1991 | Nakano et al. | |
| 4,989,992 A | 2/1991 | Piai | |
| 5,027,746 A | 7/1991 | Frijlink | |
| 5,065,698 A | 11/1991 | Koike | |
| 5,071,258 A | 12/1991 | Usher et al. | |
| 5,104,514 A | 4/1992 | Quartarone | |
| 5,108,192 A * | 4/1992 | Mailliet et al. | 374/139 |
| 5,158,128 A | 10/1992 | Inoue et al. | |
| 5,181,779 A | 1/1993 | Shia | |
| 5,246,500 A | 9/1993 | Samata et al. | |
| 5,271,967 A | 12/1993 | Kramer et al. | |
| 5,294,778 A | 3/1994 | Carman et al. | |
| 5,315,092 A | 5/1994 | Takahashi et al. | |
| 5,336,327 A | 8/1994 | Lee | |
| 5,360,269 A | 11/1994 | Ogawa et al. | |
| 5,374,315 A | 12/1994 | Deboer et al. | |
| 5,421,893 A | 6/1995 | Perlov | |
| 5,456,761 A | 10/1995 | Auger et al. | |
| 5,474,618 A | 12/1995 | Allaire | |
| 5,493,987 A | 2/1996 | McDiarmid et al. | |
| 5,514,439 A | 5/1996 | Sibley | |
| 5,527,111 A | 6/1996 | Lysen et al. | |
| 5,562,774 A | 10/1996 | Breidenbach et al. | |
| 5,571,333 A | 11/1996 | Kanaya | |
| 5,611,265 A | 3/1997 | Ronci et al. | |
| 5,697,706 A * | 12/1997 | Ciaravino et al. | 374/166 |
| 5,716,133 A | 2/1998 | Hosokawa et al. | |
| 5,788,799 A | 8/1998 | Steger et al. | |
| 5,791,782 A | 8/1998 | Wooten et al. | |
| 5,806,980 A | 9/1998 | Berrian | |
| 5,902,407 A | 5/1999 | deBoer et al. | |
| 5,904,778 A | 5/1999 | Lu et al. | |
| 5,910,221 A | 6/1999 | Wu | |
| 6,056,823 A | 5/2000 | Sajoto et al. | |
| 6,066,209 A | 5/2000 | Sajoto et al. | |
| 6,102,565 A | 8/2000 | Kita et al. | |
| 6,120,640 A | 9/2000 | Shih et al. | |
| 6,121,061 A | 9/2000 | Bilsen et al. | |
| 6,129,808 A | 10/2000 | Wicker et al. | |
| 6,170,429 B1 | 1/2001 | Schoepp et al. | |
| 6,227,140 B1 | 5/2001 | Kennedy | |
| 6,235,858 B1 | 5/2001 | Swarup et al. | |
| 6,257,758 B1 | 7/2001 | Culbertson | |
| 6,325,858 B1 | 12/2001 | Wengert et al. | |
| 6,342,691 B1 | 1/2002 | Johnsgard et al. | |
| 6,676,290 B1 | 1/2004 | Lu | |
| 7,008,802 B2 | 3/2006 | Lu | |
| 7,090,394 B2 | 8/2006 | Hashikura et al. | |
| 7,166,165 B2 | 1/2007 | Halpin | |
| 7,274,867 B2 | 9/2007 | Peukert | |
| 7,651,269 B2 | 1/2010 | Comendant | |
| 7,789,559 B2 | 9/2010 | Waser et al. | |
| 7,874,726 B2 | 1/2011 | Jacobs et al. | |
| 7,946,762 B2 | 5/2011 | Yednak, III | |
| 2002/0011211 A1 | 1/2002 | Halpin | |
| 2002/0043337 A1 | 4/2002 | Goodman et al. | |
| 2003/0002562 A1 | 1/2003 | Yerlikaya et al. | |
| 2003/0035905 A1 | 2/2003 | Lieberman et al. | |
| 2003/0192435 A1 | 10/2003 | Duncan | |
| 2005/0092733 A1 | 5/2005 | Ito et al. | |
| 2005/0101843 A1 | 5/2005 | Quinn et al. | |
| 2005/0141591 A1 | 6/2005 | Sakano | |
| 2006/0275933 A1 | 12/2006 | Du Bois et al. | |
| 2007/0062439 A1 | 3/2007 | Wada et al. | |
| 2007/0258506 A1 | 11/2007 | Schwagerman et al. | |
| 2008/0043803 A1 | 2/2008 | Bandoh | |
| 2008/0205483 A1 | 8/2008 | Rempe et al. | |
| 2008/0289574 A1 | 11/2008 | Jacobs et al. | |
| 2009/0052498 A1 | 2/2009 | Halpin et al. | |
| 2009/0159000 A1 | 6/2009 | Aggarwal et al. | |
| 2010/0145547 A1 | 6/2010 | Darabnia et al. | |
| 2010/0282163 A1 * | 11/2010 | Aggarwal et al. | 118/666 |

FOREIGN PATENT DOCUMENTS

| | | |
|---|---|---|
| EP | 0723141 | 7/1996 |
| EP | 0887632 | 12/1998 |
| FR | 1408266 | 8/1965 |
| GB | 0752277 | 7/1956 |
| JP | 02185038 | 7/1990 |
| JP | 05-023079 | 3/1993 |
| JP | 5-64627 | 3/1993 |
| JP | 05118928 | 5/1993 |
| JP | 09089676 | 4/1997 |
| JP | 10-153494 | 6/1998 |
| JP | 10-227703 | 8/1998 |
| JP | 11-118615 | 4/1999 |
| JP | 11-183264 | 7/1999 |
| JP | 11-183265 | 7/1999 |
| JP | 11-287715 | 10/1999 |
| JP | 2004113270 | 4/2004 |
| JP | 2005-172489 | 6/2005 |
| JP | 2006-090762 | 4/2006 |
| JP | 2006-153706 | 6/2006 |
| KR | 10-2000-0031098 | 6/2000 |
| KR | 10-2002-0086763 | 11/2002 |
| KR | 10-2003-0092305 | 12/2003 |
| WO | 9531582 | 11/1995 |
| WO | 9706288 | 2/1997 |
| WO | 9923276 | 5/1999 |
| WO | 0111223 | 2/2001 |

OTHER PUBLICATIONS

Final Office Action for U.S. Appl. No. 12/140,809 dated Dec. 28, 2010.
Non-Final Office Action dated Mar. 15, 2011 for U.S. Appl. No. 12/193,924.
Notice of Allowance dated Mar. 17, 2011 for U.S. Appl. No. 12/140,809.
International Preliminary Report on Patentability dated Jun. 23, 2011 in Application No. PCT/US2009/066377.
Non-Final Office Action for U.S. Appl. No. 12/121,085 dated Apr. 28, 2010.
International Search Report and Written Opinion for International Application No. PCT/US2010/033244 dated Jun. 29, 2010.
International Search Report and Written Opinion for International Application No. PCT/US2009/066377 dated Jul. 1, 2010.
CN; Office Action dated Jul. 14, 2010 in Application No. 200880012927.
PCT; International Search Report and Written Opinion dated Jul. 29, 2010 in Application No. PCT/US2010/033248.
USPTO; Office Action dated Sep. 13, 2010 in U.S. Appl. No. 12/140,809.X.
Notice of Allowance dated Jul. 26, 2010 in U.S. Appl. No. 12/121,085.
Notice of Allowance dated Oct. 4, 2010 in U.S. Appl. No. 12/121,085.
Introduction to Materials Science for Engineers, 3rd Ed., James F. Schackelford, pp. 398, Macmillan Publishing Co. (1992).
Linke, J. and Vietzke, E., "Behavior of Boron Doped Graphites, Plasma Sprayed Boron Carbides and a-C/B H as Plasma Facing Material," J. Fusion Tech., V.20, pp. 228-231 (Sep. 1991).
Ponnekanti et al., "Failure Mechanisms of Anodized Aluminum Parts Used in Chemical Vapor Deposition Chambers," J. Vac. Sci. Technol. A 14(3) (May 1, 1996).
"Thermocouples for Silicon Process Technologies," Vulcan Electric Company brochure.
"Thermocouples for the Semiconductor Industry," Engelhard Corporation brochure (2004).
PCT Notification of Transmittal of the International Search Report and The Written Opinion of the International Searching Authority, or the Declaration, dated Aug. 21, 2008, for International App. No. PCT/US2008/063919.
PCT Notification of Transmittal of the International Search Report and The Written Opinion of The International Searching Authority, or the Declaration, dated Mar. 5, 2009 for International App. No. PCT/US2008/074063.

PCT Notification of Transmittal of the International Search Report and The Written Opinion of The International Searching Authority, or the Declaration, dated Nov. 27, 2009, for International App. No. PCT/US2009/043454.

Non-Final Office Action dated Jul. 28, 2011 for U.S. Appl. No. 12/330,096.

Non-Final Office Action dated Aug. 3, 2011 for U.S. Appl. No. 12/436,300.

Examination Report Dated May 26, 2011 for App. No. 09733043.5-2313.

* cited by examiner

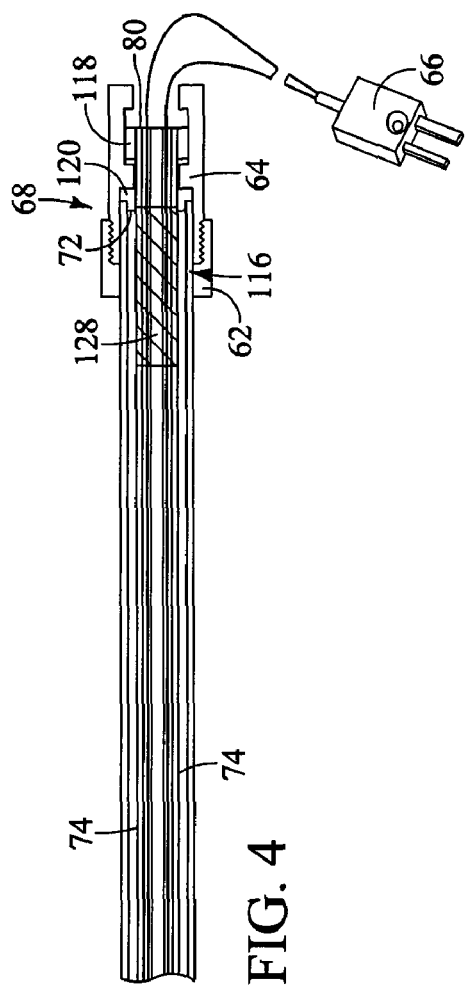
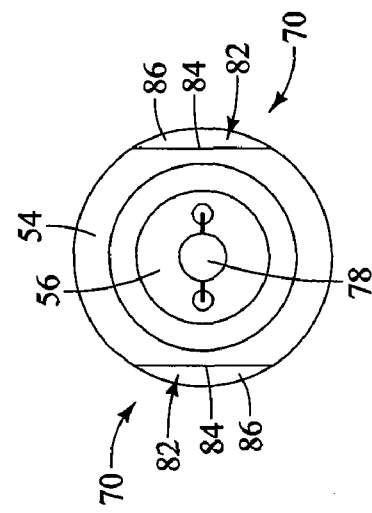
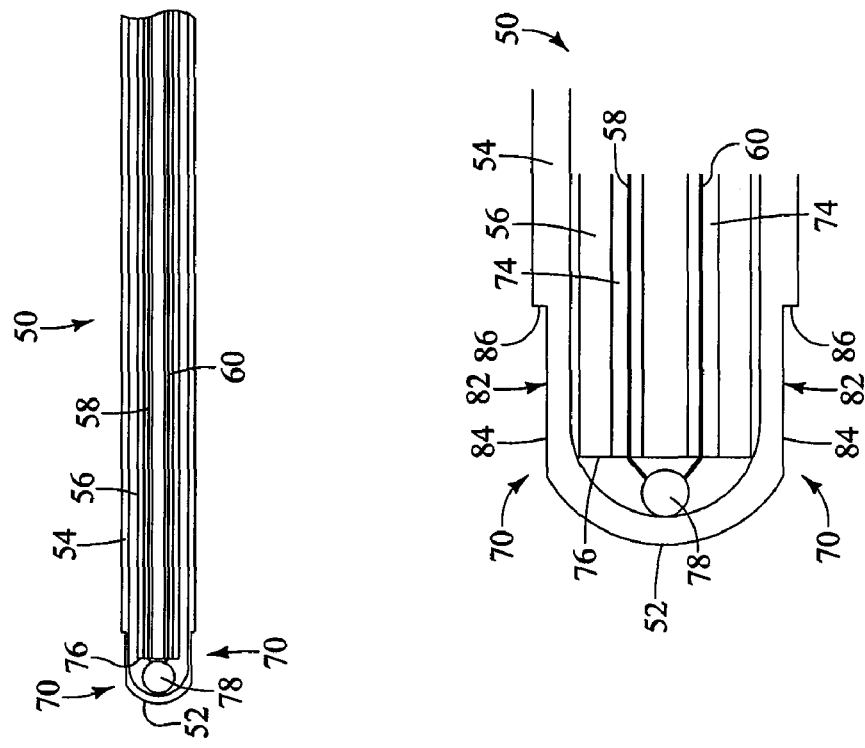
FIG. 4
FIG. 5B
FIG. 5A

THERMOCOUPLE

FIELD OF THE INVENTION

The present invention relates to a temperature sensor, and more particularly to a temperature sensor configured to enhance accuracy of temperature control in a semiconductor processing apparatus.

BACKGROUND OF THE INVENTION

High-temperature semiconductor processing chambers are used for depositing various material layers onto a substrate surface or surfaces. Typically, one or more substrates or workpieces, such as a silicon wafer, are placed on a workpiece support within the processing chamber to be processed. Both the substrate and workpiece support are heated to a desired temperature. In a typical processing step, reactant gases are passed over each heated substrate, whereby a chemical vapor deposition (CVD) or an atomic layer deposition (ALD) reaction deposits a thin layer of the reactant material in the reactant gases on the substrate surface(s). Through subsequent processes, these layers are made into integrated circuits, and tens to thousands or even millions of integrated devices, depending on the size of the substrate and the complexity of the circuits.

Various process parameters must be carefully controlled to ensure the high quality of the resulting deposited layers. One such critical parameter is the temperature of the substrate during each processing step. During CVD, for example, the deposition gases react at particular temperatures to deposit the thin layer on the substrate. If the temperature varies greatly across the surface of the substrate, the deposited layer could be uneven which may result in unusable areas on the surface of the finished substrate. Accordingly, it is important that the substrate temperature be stable and uniform at the desired temperature before the reactant gases are introduced into the processing chamber.

Similarly, non-uniformity or instability of temperatures across a substrate during other thermal treatments can affect the uniformity of resulting structures on the surface of the substrate. Other processes for which temperature control can be critical include, but are not limited to, oxidation, nitridation, dopant diffusion, sputter depositions, photolithography, dry etching, plasma processes, and high temperature anneals.

Methods and systems are known for measuring the temperature at various locations near and immediately adjacent to the substrate being processed. Typically, thermocouples are disposed at various locations near the substrate being processed, and these thermocouples are operatively connected to a controller to assist in providing a more uniform temperature across the entire surface of the substrate. For example, U.S. Pat. No. 6,121,061 issued to Van Bilsen teaches a plurality of temperature sensors measuring the temperature at various points surrounding the substrate, including a thermocouple placed near the leading edge of the substrate, another near the trailing edge, one at a side, and another below the substrate near the center of the substrate.

Thermocouples are a type of temperature measuring device often used in semiconductor processing reaction chambers to measure temperatures at various locations around the substrate being processed and within the reaction chamber in general. Thermocouples typically include at least one junction formed by fusing the ends of multiple wires together, wherein the wires are formed of at least two dissimilar metals to that a thermocouple is formed therebetween. The thermocouples are installed within the reaction chamber to ensure that the junction(s) of the thermocouple are precisely located to provide a temperature measurement at a particular location. When the junction of the thermocouple is offset from the precise location during installation, the temperature data provided by the thermocouple is less accurate the farther away the junction is from the desired location. Additionally, for thermocouples having multiple junctions located along the length thereof, rotation of the thermocouple may also cause the junction to be located further away from the desired location.

Typically, when thermocouples commonly known in the art are manufactured, there are no features that positively locate the junction within the thermocouple. Also, when thermocouples are installed within the reaction chamber of a semiconductor processing apparatus, there are no features on thermocouples commonly known in the art to ensure that the thermocouple is properly aligned within the apparatus to such that the junction(s) is located at a precise location for a temperature measurement.

Accordingly, there exists a need for a thermocouple having internal alignment features that allow the junction to be consistently located within the thermocouple during manufacture. There also exists a need for a thermocouple having external alignment features that allow thermocouples to be positively located within a reaction chamber during installation.

BRIEF SUMMARY OF THE INVENTION

In one aspect of the present invention, a thermocouple disposable within a susceptor ring is provided. The thermocouple comprises a sheath disposable within the susceptor ring. The thermocouple further includes at least one thermocouple junction located within the sheath. The thermocouple also includes at least one inner alignment feature and/or at least one outer alignment feature for positively locating or aligning at least one thermocouple junction relative to the susceptor ring.

In another aspect of the present invention, a thermocouple for temperature measurement within a bore of a susceptor ring is provided. The thermocouple comprises a sheath having a measuring tip located at one end thereof and an opening located at an opposing end thereof. The thermocouple further includes a support member disposed within the sheath. The thermocouple also includes at least one thermocouple junction located within the sheath. The thermocouple further includes at least one outer alignment feature located adjacent to the measuring tip or an inner alignment feature located adjacent to the opening. The outer alignment feature and the inner alignment feature are configured to positively locate or align the thermocouple junction(s) within the bore of the susceptor ring.

In a further aspect of the present invention, a system for measuring temperature within a semiconductor processing reactor is provided. The system includes a susceptor ring and a thermocouple disposable within a bore formed in the susceptor ring. The susceptor ring has at least one bore formed therein, and the bore includes a closed end and forms a first cross-sectional shape. A recessed region is formed at the closed end of the bore, wherein the recessed region forms a second cross-sectional shape within the bore. The second cross-sectional shape is different than the first cross-sectional shape. The thermocouple is disposable within the bore, and the thermocouple includes a sheath having a measuring tip located at one end thereof and an opening located at an opposing end thereof. The thermocouple also includes at least one thermocouple junction located within the sheath. The thermocouple further includes at least one outer alignment feature located adjacent to the measuring tip and/or an inner alignment feature located adjacent to the opening, wherein the outer alignment feature and the inner alignment feature are configured to positively locate or align the thermocouple junction within the bore of the susceptor ring Advantages of the present invention will become more apparent to those skilled in the art from the following description of the embodiments of the invention which have been shown and described by way of illustration. As will be realized, the invention is capable of other and different embodiments, and its details are capable of modification in various respects. Accordingly, the drawing(s) and description are to be regarded as illustrative in nature and not as restrictive.

BRIEF DESCRIPTION OF SEVERAL VIEWS OF THE DRAWINGS

FIG. 4 is a side cross-sectional view of an embodiment of a thermocouple of the present invention;

FIG. 5A is a magnified side cross-sectional view of the measuring tip of the thermocouple of FIG. 4;

FIG. 5B is a magnified end view of the measuring tip of the thermocouple of FIG. 4;

DETAILED DESCRIPTION OF THE PREFERRED EMBODIMENT

Figure 1:
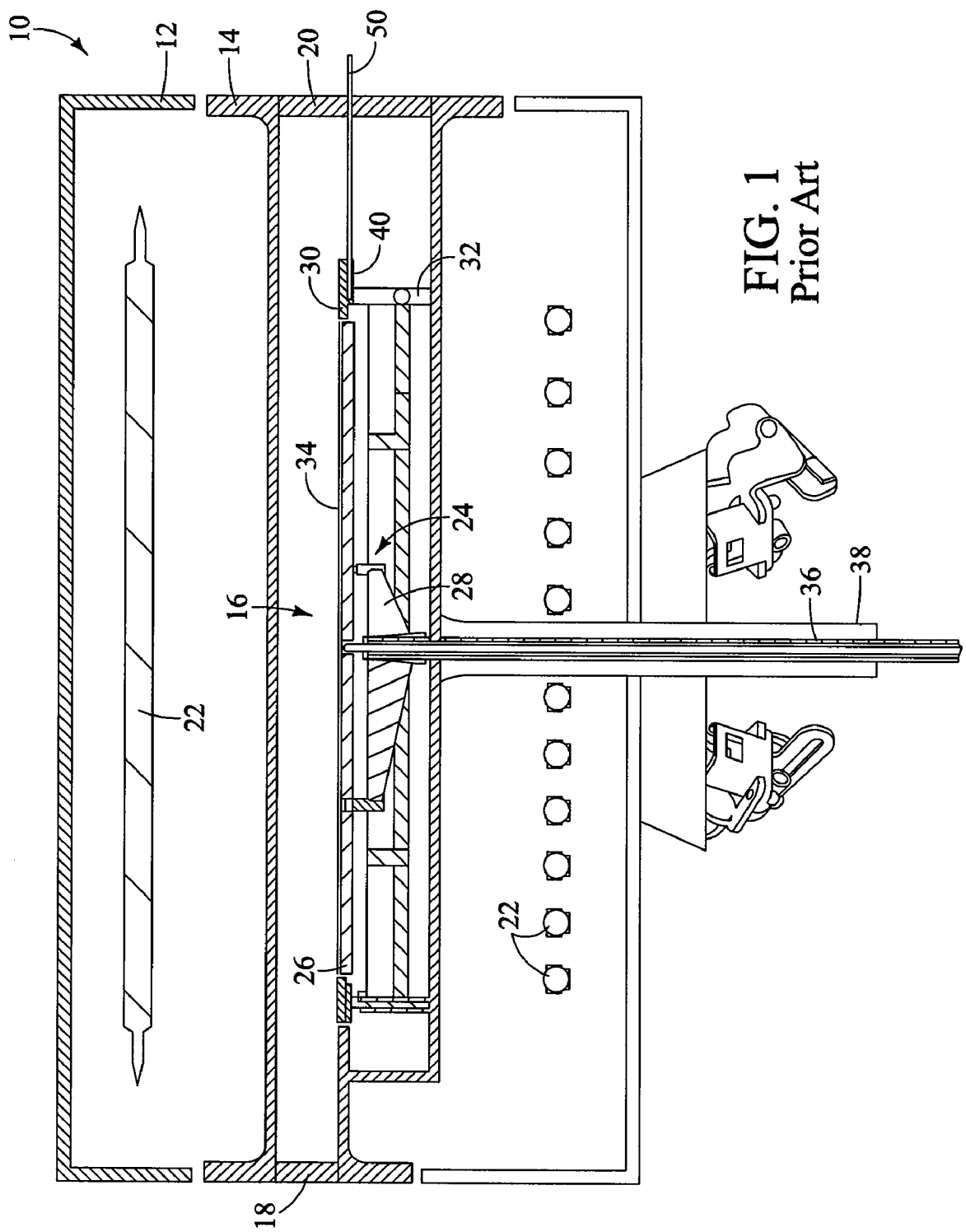
FIG. 1 is a side cross-sectional view of an embodiment of a semiconductor processing reactor.

Referring to FIG. 1, an exemplary embodiment of a semiconductor processing reactor 10 generally known in the art is shown. The reactor 10 may be a configured for chemical vapor deposition ("CVD") processes, atomic layer deposition ("ALD") process, or any other processes for depositing thin layers of material onto a substrate located within the reactor 10. FIG. 1 illustrates a known reactor 10 typically used in the Epsilon® tools produced by ASM America, Inc. of Phoenix, Ariz. The reactor 10 of the illustrated embodiment includes a housing 12 and a cold-wall, single-substrate reaction chamber 14 located within the housing 12. However, it should be understood by one skilled in the art that the reaction chamber 14 can be of any type capable of processing substrates therein. The reaction chamber 14 defines a reaction space 16 within which chemical reactions take place. The reaction chamber 14 includes an inlet 18 through which process gases are introduced into the reaction space 16 and an outlet 20 through which process gases exit the reaction space 16. The reactor 10 further includes a plurality of heating elements 22 disposed within the housing 12 to provide radiant heat to the reaction chamber 14.

In an embodiment, a substrate support assembly 24 is located at least partially within the reaction chamber 14, as shown in FIG. 1. The substrate support assembly 24 includes a substrate holder 26, a holder support member 28, a susceptor ring 30, and a susceptor ring support 32. The substrate holder 26 is configured to support a substrate 34 within the reaction space 16 during processing. The holder support member 28 is operatively connected to the substrate holder 26, and the holder support member 28 is attached to a shaft 36 that extends downwardly through a tube 38 extending outwardly from the bottom surface of the reaction chamber 14. The shaft 36 is operatively connected to a motor (not shown) located external to the reactor 10 that is configured to rotate the shaft 36, thereby causing the holder support member 28 and the substrate holder 26 to rotate in a corresponding manner within the reaction chamber 14.

Figure 2:
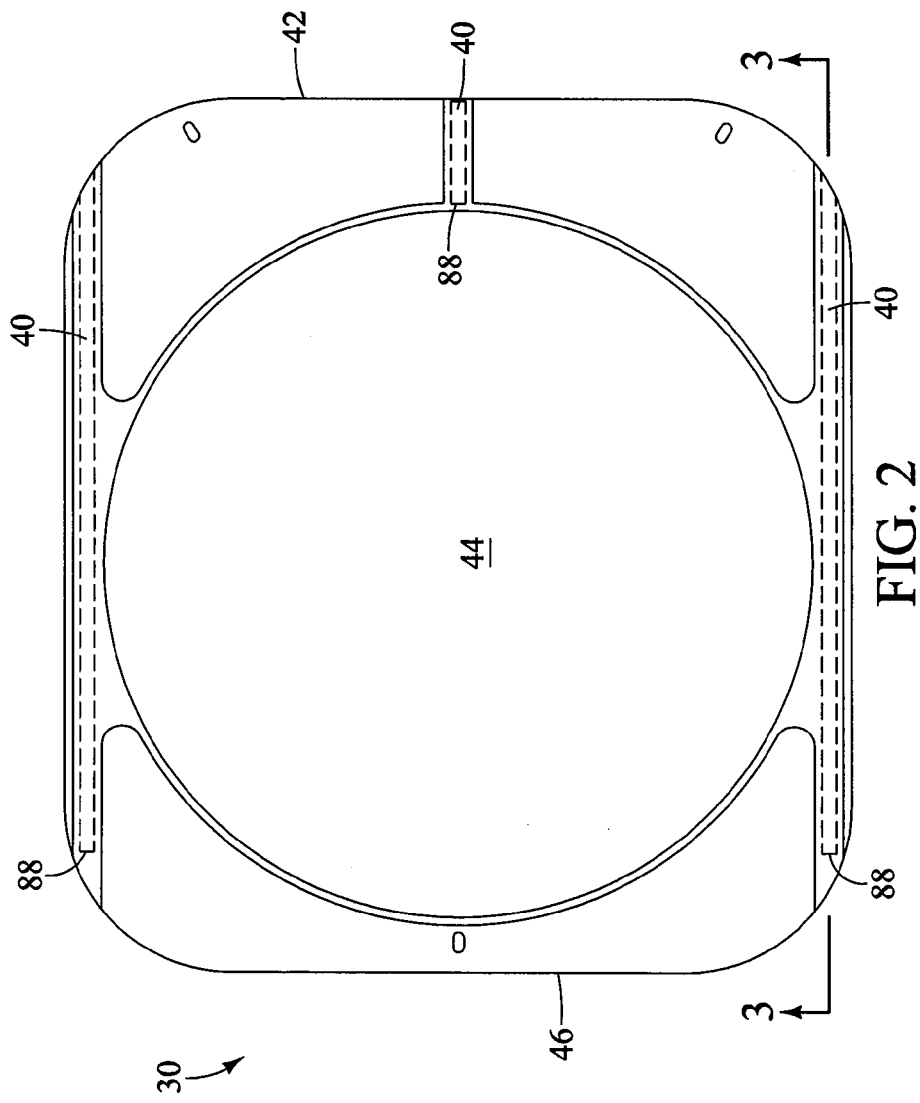
FIG. 2 is a bottom view of an embodiment of a susceptor ring.

In an embodiment, the susceptor ring 30 surrounds the substrate holder 26 and is configured to compensate for the temperature loss from the edges of the substrate 34 and substrate holder 26 during processing. As shown in FIG. 1, the susceptor ring 30 is supported by the susceptor ring support 32 that is operatively attached to the lower surface of the reaction chamber 14. In an embodiment, the susceptor ring 30 is formed as a single piece and includes at least one bore 40 formed through the downstream, or rear surface 42 thereof, as shown in FIGS. 1-2. It should be understood by one skilled in the art that the susceptor ring 30 may have any number of bores 40 formed therein and the bores 40 can be formed into any surface of the susceptor ring 30. In the exemplary embodiment illustrated in FIGS. 1-3, the susceptor ring 30 includes three bores 40 formed through the rear surface 42 thereof. The bores 40 are configured to receive a temperature measuring device such as a thermocouple, a pyrometer, or any other device capable of measuring the temperature at a particular location within the susceptor ring 30. The bores 40 are formed through only a portion of the length of the susceptor ring 30 such that one end of the bore 40 is open and the other end is closed, thereby providing a blind hole for receiving the temperature measuring device.

The bores 40 are formed adjacent to an aperture 44 formed in the susceptor ring 30, as illustrated in FIG. 2. The length and position of the bores 40 allows a temperature measuring device located therewithin to measure the localized temperature at various positions about the substrate holder 26 (FIG. 1). In an embodiment, the closed end of each of the side bores 40 that extend along the sides of the susceptor ring 30 is located adjacent to the leading edge 46 of the susceptor ring 30. In another embodiment, the closed end of each of the side bores 40 is located about half the distance between the trailing edge 42 and the leading edge 46 of the susceptor ring 30 such that the closed end of the side bores 40 is positioned at the closest point to the aperture 44. It should be understood by one skilled in the art that the side bores 40 can be of any length, and the length of the opposing side bores may be different. In an embodiment, the rear bore 40 located between the side bores 40 extends such that the closed end of the rear bore 40 is positioned immediately adjacent to the edge of the aperture 44.

Figure 3:
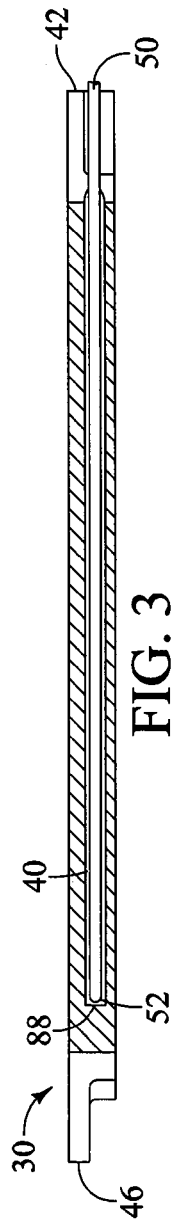
FIG. 3 is a side cross-sectional view of a bore of the susceptor ring of FIG. 2.

Referring to FIG. 3, a cross-section of a side bore 40 of the susceptor ring 30 is shown, wherein a temperature measuring device is located within the bore 40. In the illustrated embodiment, the temperature measuring device is a thermocouple 50. The measuring tip 52 of the thermocouple 50 is positioned immediately adjacent to the closed end of the bore 40, but it should be understood by one skilled in the art that the measuring tip 52 may be located at any position along the length of the bore 40.

An embodiment of an improved thermocouple 50 is illustrated in FIG. 4. In the illustrated embodiment, the thermocouple 50 includes a sheath 54, support member 56, first wire 58, second wire 60, nut 62, a cap 64, a plug 66 as well as an inner alignment feature 68 and/or an outer alignment feature 70. The sheath 54 is an elongated member having the measuring tip 52 forming one distal end thereof and the opposing distal end forming an opening 72 therein. The sheath 54 has a substantially constant thickness along the entire length thereof, but it should be understood that the sheath 54 may be formed having different thicknesses along the length thereof. In an embodiment, the sheath 54 is formed of quartz, but any other material sufficient to withstand the cyclical temperature changes within the reaction chamber 14 can be used. The measuring tip 52 of the sheath 54 may form a rounded end, but one skilled in the art should understand that the measuring tip 52 can be formed of any shape, such as conical, hemispherical, or the like. In another embodiment (not shown), for example, the measuring tip 52 forms a flat surface.

As illustrated in FIG. 4, the support member 56 is partially disposed within the sheath 54 and extends through the opening 72 to the inner surface of the measuring tip 52. In an embodiment, the support member 56 is an elongated member formed of ceramic, but any other material sufficient to withstand the cyclical temperatures within the reaction chamber 14 (FIG. 1) can be used. In an embodiment, the support member 56 includes two bores 74 that are formed along at least a portion of the length of the support member 56. It should be understood by one skilled in the art that support member 56 may include any number of bores 74 formed therethrough. Each bore 74 is configured to receive one of the first and second wires 58, 60 therein. A portion of each of the first and second wires 58, 60 extend beyond the first distal end 76 of the support member 56 adjacent to the measuring tip 52 of the sheath 54. These free ends of the first and second wires 58, 60 adjacent to the first distal end 76 of the support member 56 are fused together to form a junction 78. The first and second wires 58, 60 are formed of dissimilar metals, thereby forming a thermocouple therebetween. In an embodiment, as shown in FIG. 4, the junction 78 is located in an abutting relationship with the inner surface of the sheath 54 adjacent to the measuring tip 52. In another embodiment (not shown), the junction 78 is located adjacent to the inner surface of the sheath 54 in a spaced-apart manner relative to the measuring tip 52. The exemplary embodiment of the thermocouple illustrated in FIGS. 4-5B is a single-junction thermocouple in which the junction 78 is located at the distal end of the thermocouple 50 at the measuring tip 52. It should be understood by one skilled in the art that alternative embodiments of the thermocouple 50 that the junction 78 may be located at any position along the length of the thermocouple, or the thermocouple 50 may include multiple junctions 78 located at substantially the same or different positions along the length of the thermocouple, as will be explained below.

In an embodiment, the second distal end 80 of the support member 56 extends through the opening 72 of the sheath 54, as illustrated in FIG. 4. The ends of the bores 74 are located beyond the opening 72 such that the first and second wires 58, 60 likewise extend beyond the opening 72 of the sheath 54. The remaining free end of each of the first and second wires 56, 58 is operatively connected to a plug 66. The nut 62 and cap 64 are configured to secure the portion of the support member 56 extending beyond the opening 72 to the sheath 54 to ensure that the support member 56 remains located within the sheath 54.

One difficulty, in particular, when installing a thermocouple within a blind hole, or bore, of a susceptor ring is properly aligning or positioning the measuring junction of the thermocouple within a bore. Because the thermocouple is being inserted into a blind hole, it is difficult to ensure proper positioning and/or alignment because the operator cannot view inside the bore to verify positioning of the measuring junction(s) therewithin. When installing a thermocouple having a measuring junction at the distal end of the thermocouple, it is often desired to position the measuring tip of the thermocouple immediately adjacent to the closed end of the bore without contacting the closed end of the bore. However, the operator may extend the thermocouple into the bore too far such that the measuring tip contacts the susceptor ring which can cause damage to the sheath and reduce the accuracy of the temperature measurement or cause premature failure of the thermocouple. Alternatively, if the thermocouple is not inserted far enough into the bore, the junction will be spaced too far away from the closed end of the bore such that the increased distance from the desired position of the junction reduces the accuracy of the temperature measurement. When installing a thermocouple having at least one measuring junction located along the length thereof, spaced apart from the measuring tip, it is difficult to ensure the junction is properly located without the thermocouple from rotating within the bore, thereby moving the junction away from the desired position for optimum temperature measurement. For processes that are highly temperature-dependent, an accurate and repeatable temperature measurement is often essential to ensuring the best conditions for the process. Accordingly, the ability to positively locate the junction of a thermocouple at a pre-determined position to optimize the accuracy and repeatability of the temperature measurement is an important factor when installing the thermocouple within the reaction chamber 14. The inner alignment feature 68 and the outer alignment feature 70, either alone or in combination, are configured to consistently positively position and/or align the junction(s) 78 of the thermocouple 50 relative to the susceptor ring 30.

As illustrated in FIGS. 4-5B, an embodiment of a thermocouple 50 having a pair of outer alignment features 70 is shown. It should be understood by one skilled in the art that while the illustrated embodiment includes two outer alignment features 70, the thermocouple 50 can include any number of outer alignment features 70. The outer alignment features 70 of the thermocouple 50 are configured to ensure that the junction 78 located at the measuring tip 52 is consistently and positively positioned within a bore 40 (FIG. 3) of the susceptor ring 30. The outer alignment feature 70 will be described with reference to a single-junction thermocouple in which the junction 78 is positioned in an abutting relationship with, or immediately adjacent to, the inner surface of the sheath 54 at the measuring tip 52. It should be understood by one skilled in the art that in other embodiments, the junction 78 may be located at any position along the length of the thermocouple 50, or the thermocouple 50 may include multiple junctions 78.

In an embodiment, each outer alignment feature 70 includes a cut-out 82 formed in the outer surface at the measuring tip 52 of the sheath 54, as shown in FIGS. 4-5B. In the illustrated embodiment, the cut-out 82 includes a locating surface 84 and a stop surface 86. In an embodiment, the locating surface 84 extends from a position near the measuring tip 52 of the sheath 54 and extends rearwardly toward the opening 72 of the sheath 54. The locating surface 84 is a substantially planar surface oriented substantially parallel to the longitudinal axis of the sheath 54, and the planar surface forms a chord with respect to a cylindrical sheath. The stop surface 86 is a surface that is oriented in a generally transverse manner relative to the locating surface 84, thereby forming an angle between the stop surface 86 and the locating surface 84. In an embodiment, the stop surface 86 is oriented normal to the locating surface 84 forming a substantially right angle therebetween. In another embodiment, the stop surface 86 is oriented relative to the locating surface 84 whereby an obtuse angle is formed therebetween. The stop surface 86 extends from the locating surface 84 radially outwardly to the edge of the sheath 54 to form the cut-out 82 therein. The cross-sectional shape of the cut-out 82 corresponds with the shape at the closed end 88 of a bore 40 in the susceptor ring 30 (FIGS. 2-3).

In the embodiment of the susceptor ring 30 illustrated in FIGS. 2-3, the bores 40 extend nearly the entire length of the rib into which they are formed to provide a blind hole into the rib of the susceptor ring 30 for receiving a thermocouple 50. In an embodiment, the blind-hole bores 40 of the susceptor ring 30 are formed by removing material from the susceptor ring 30 to form the recess only a portion of the length of the susceptor ring 30. In another embodiment, the blind-hole bores 40 are formed by removing material from the susceptor ring 30 to form the recess along the entire length of the susceptor ring 30 and a plug or insert is later inserted into an end of the recess and sealed to form the blind hole.

Figure 6B:
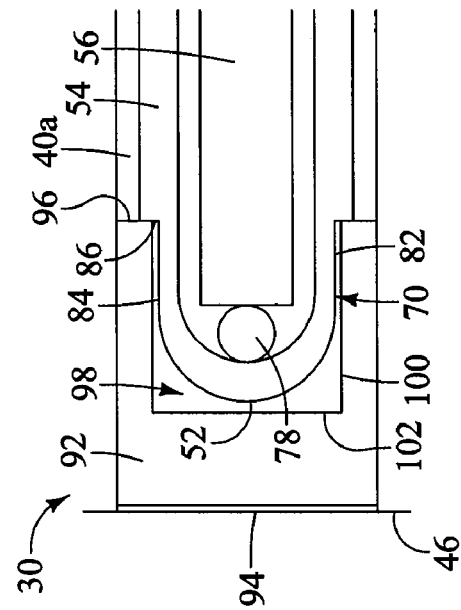
FIG. 6B is a top view of the outer alignment feature at the measuring tip and bore of FIG. 6A.
Figure 6A:
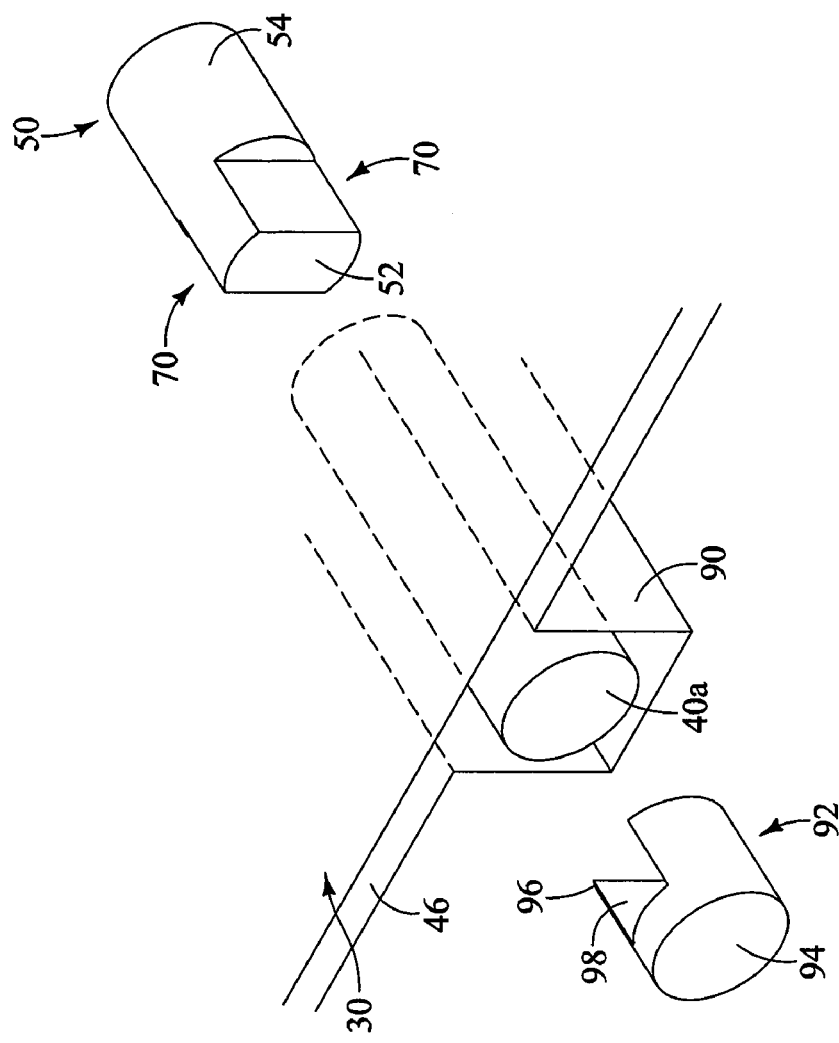
FIG. 6A is an isometric view of an embodiment of an outer alignment feature at the measuring tip of a thermocouple and the closed end of a bore of a susceptor ring.

In an embodiment of the susceptor ring 30, as shown in FIGS. 6A-6B, each bore 40a extends the entire length of the rib 90 such that the bore 40a is open at both ends. In an embodiment, an insert 92 is insertable into the end of the bore 40a to provide a cross-sectional shape that is different than the cross-sectional shape of the rest of the length of the bore 40a. In an embodiment, the bore 40a through the rib 90 is formed as a cylindrical hole and the insert 92 is likewise a cylindrical member configured to fit within the end of the bore 40a. It should be understood by one skilled in the art that the bore 40a can be formed having any cross-sectional shape, and the general cross-sectional shape of the insert 92 corresponds to the cross-sectional shape of the bore 40a.

In an embodiment, the insert 92 is a cylindrical member that is configured to be inserted into a bore 40a formed in the susceptor ring 30 to form the closed end 88 (FIGS. 2-3) of the bore. The insert 92 includes a first end surface 94, an opposing second end surface 96, and a recessed region 98 extending longitudinally from the second end surface 96. In an embodiment, the recess region 98 includes a pair of opposing longitudinal surfaces 100 that extends substantially parallel to the longitudinal axis of the insert 92 and a transverse surface 102 extending between the longitudinal surfaces 100. It should be understood by one skilled in the art that the recessed region 98 of the insert 92 may include any number of longitudinal surfaces 100, whereby the longitudinal surfaces 100 form a cross-sectional shape that is different than the cross-sectional shape of the bore 40a into which the insert 92 is insertable. The insert 92 is configured to plug and seal the end of the bore 40a adjacent to the leading edge 46 of the susceptor ring 30 to provide a closed end to the bore 40a. The insert 92 is further configured to receive the measuring tip 52 of the thermocouple to positively align and position the junction 78 within the bore 40a. In an embodiment, the insert 92 is disposed within the bore 40a, the insert 92 is positioned such that the longitudinal surfaces 100 are oriented in a substantially vertical manner. In another embodiment, the insert 92 is disposed within the bore 40a such that the longitudinal surfaces 100 are oriented at a non-vertical angle.

Figure 7B:
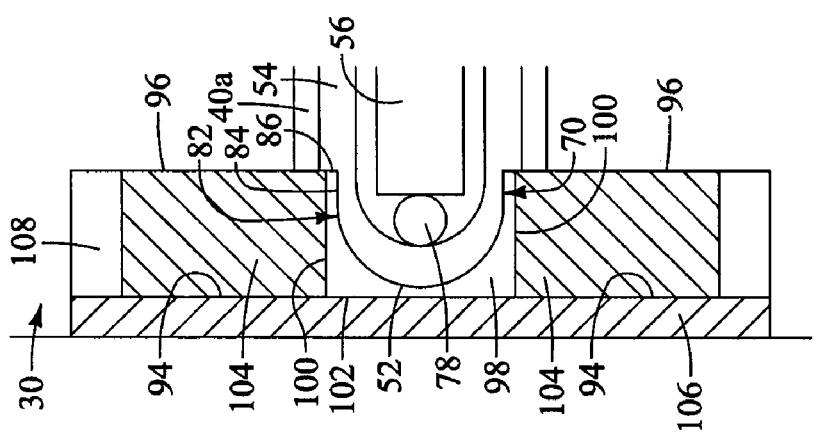
FIG. 7B is a top view of the outer alignment feature at the measuring tip and bore of FIG. 7A
Figure 7A:
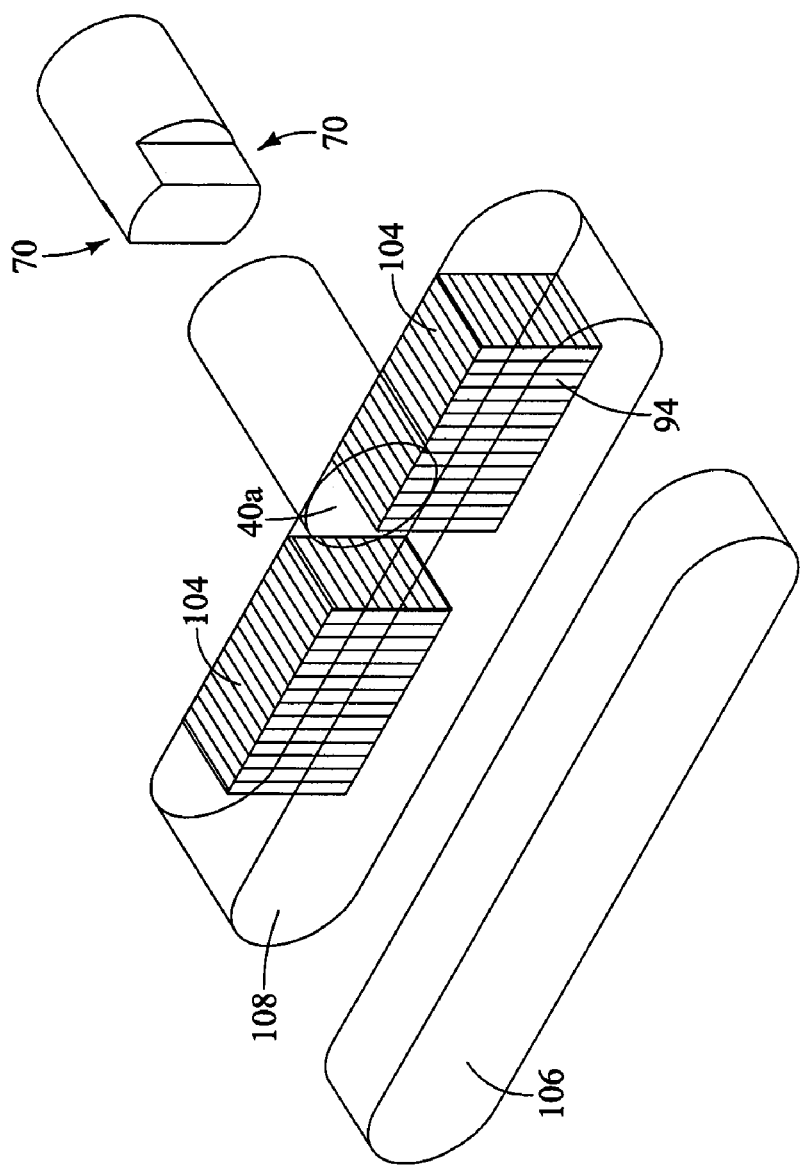
FIG. 7A is an isometric view of an embodiment of an outer alignment feature at the measuring tip of a thermocouple and the closed end of a bore of a susceptor ring.

In another embodiment, as illustrated in FIGS. 7A-7B, the closed end of the blind-hole bore 40a can be formed using a pair of blocks 104 and a plug 106 positioned within a detent 108 formed into the susceptor ring 30. The blocks 104 are solid members formed of the same material as the susceptor ring 30. When positioned within the detent 108, the blocks 104 and plug 106 form a recessed region 98 at the end of the bore 40a, wherein the recessed region 98 is configured to receive the measuring tip 52 of the thermocouple 50. Each block 104 includes a first end surface 94, a second end surface 96, and a longitudinal surface 100 extending between the end surfaces 94, 96. The blocks 104 are positioned within the detent 108 on opposing sides of the bore 40a, wherein the longitudinal surfaces 100 of the blocks 104 are directed toward each other. The blocks 104 are positioned within the detent 108 to cover a portion of the bore 40a, thereby modifying the cross-sectional shape of the bore 40a. Because the blocks 104 cover a portion of the bore 40a, the second end surfaces 96 of the blocks 104 are exposed and are configured to contact the stop surfaces 86 of the cut-outs 82 of the thermocouple 50. The blocks 104 are secured within the detent 108 to prevent the blocks 104 from moving. The plug 106 is inserted into the detent 108 and contacts the surfaces of the blocks 104 adjacent to the longitudinal surfaces 100 thereof. The cross-sectional shape of the plug 106 is substantially the same as the shape of the detent 108 so as to completely fill and cover the opening of the detent 108 and to seal the bore 40a. The portion of the surface of the plug 106 located in the space between the longitudinal surfaces 100 of the blocks 104 forms a transverse surface 102 within the recessed region 98.

The depth of the recessed region 98, in combination with the length of the cut-out 82 of the thermocouple 50, determines the position and alignment of the junction 78 when the thermocouple 50 is inserted into the bore 40a and the measuring tip 52 of the sheath 54 is received within the recessed region 98, as shown in FIGS. 6B and 7B. When the thermocouple 50 is inserted into the bore 40a, the measuring tip 52 of the sheath 54 is receivable within the recessed region 98 only when the locating surfaces 84 of the sheath 54 are aligned in a substantially parallel manner relative to the corresponding longitudinal surfaces 100 of the recessed region 98. The cross-sectional shape of the sheath 54 is slightly smaller than the opening of the recessed region 98 of the insert to allow the sheath 54 and the susceptor ring 30 to thermally expand or contract without the sheath grinding or contacting the susceptor ring 30, which may generate particles that are harmful to the deposition process or may also reduce the lifetime of the thermocouple 50. The measuring tip 52 of the thermocouple 50 is inserted into the recessed region 98 until the stop surface 86 of each cut-out 82 of the sheath 54 contacts the second end surface 96, thereby preventing further insertion of the thermocouple 50 into the bore 40a. In an embodiment, when the stop surface 86 of the cut-outs 82 contacts the second end surface 96, the measuring tip 52 remains spaced-apart from the transverse surface 102 of the recessed region 98. In another embodiment, when the stop surface 86 of the cut-outs 82 contacts the second end surface 96, the measuring tip 52 abuts the transverse surface 102 of the recessed region 98.

Given the length of the longitudinal surfaces 100 of the recessed region 98 as well as the pre-determined position of the junction 78 relative to the transverse surface 102 of the recessed region 98, the length of the locating surface 84 of the cut-outs 82 and the position of the stop surfaces 86 relative to the measuring tip 52 can be determined to ensure proper positioning of the junction 78 within the bore 40a. Alternatively, given the length of the locating surfaces 84 and the position of the stop surfaces 86 of the cut-outs 84 as well as the pre-determined position of the junction 78 relative to the transverse surface 102 of the recessed region 98, the length of the longitudinal surfaces 100 of the recessed region 98 can be determined to ensure proper positioning of the junction 78 within the bore 40a. It should be understood by one skilled in the art that the determination of the optimum position of the junction 78 relative to the end of the bore 40a can be accomplished by modifying the dimensions of the recessed region 98 and/or the dimensions of the cut-outs 82 of the thermocouple 50. The outer alignment feature 70 of the thermocouple 50 is configured to positively locate the junction 78 of the thermocouple 50 within the bore 40a to optimize the accuracy of the thermocouple 50. It should be understood by one skilled in the art that the outer alignment feature 70 is configured to positively locate one or more junctions 78 located at any position along the length of the thermocouple 50.

Figure 8A:
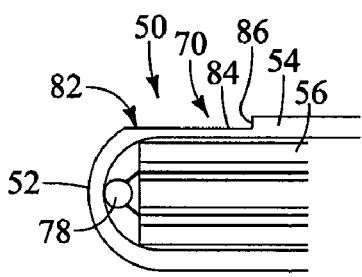
FIG. 8A is a magnified side view of an embodiment of a thermocouple having two outer alignment features.
Figure 8B:
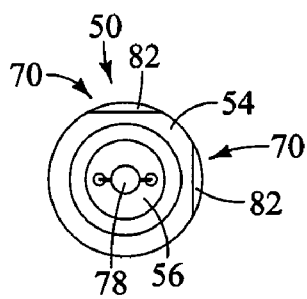
FIG. 8B is a magnified end view of the thermocouple having two outer alignment features of FIG. 8A.
Figure 8C:
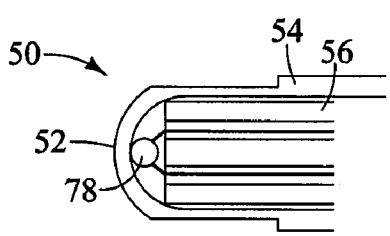
FIG. 8C is a magnified side view of an embodiment of a thermocouple having two outer alignment features.
Figure 8D:
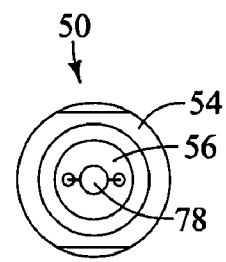
FIG. 8D is a magnified end view of the thermocouple having two outer alignment features of FIG. 8C.
Figure 8E:
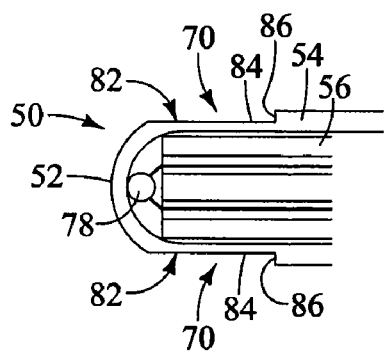
FIG. 8E is a magnified side view of an embodiment of a thermocouple having four outer alignment features.
Figure 8F:
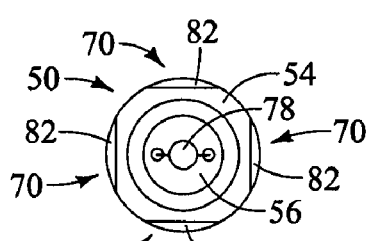
FIG. 8F is a magnified end view of the thermocouple having four outer alignment features of FIG. 8E.

In another embodiment, the thermocouple 50 includes two outer alignment features 70 formed into the sheath 54 adjacent to the measuring tip 52, as illustrated in FIGS. 8A-8B. Each outer alignment feature 70 includes a cut-out 82, wherein one of the cut-outs 82 is formed at an angle relative to the other cut-out 82. In the illustrate embodiment, the cut-outs 82 are oriented at a substantially right angle therebetween. In another embodiment (not shown), the cut-outs 82 are oriented at a non-right angle therebetween. In yet another embodiment, as shown in FIGS. 8C-8D, the thermocouple 50 includes two outer alignment features 70 formed into the sheath 54 adjacent to the measuring tip 52. Each outer alignment feature 70 includes a cut-out 82, wherein the cut-outs 82 are oriented in a substantially parallel manner therebetween. In the illustrated embodiment, the cut-outs 82 are oriented in a substantially horizontal manner. In the embodiment illustrated in FIGS. 5A-5B, the cut-outs 82 are oriented in a substantially parallel manner and further oriented in a substantially vertical manner. In yet another embodiment (not shown), the parallel cut-outs 82 are oriented in a non-horizontal and non-vertical manner. In a further embodiment, as illustrated in FIGS. 8E-8F, the thermocouple 50 includes four outer alignment features 70 formed into the sheath 54 adjacent to the measuring tip 52. Each outer alignment feature 70 includes a cut-out 82, wherein each of the cut-outs 82 is oriented at a substantially right angle relative to the adjacent cut-out 82. It should be understood by one skilled in the art that any number of cut-outs 82 can be formed into the sheath 54 to create a cross-sectional shape that is different than the cross-sectional shape along the rest of the length of the sheath 54.

Figure 8G:
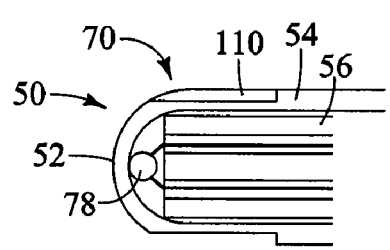
FIG. 8G is a magnified side view of an embodiment of a thermocouple having a single outer alignment feature.
Figure 8H:
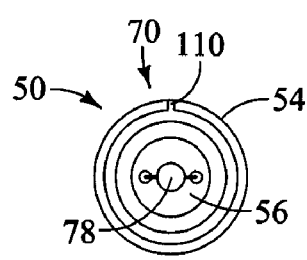
FIG. 8H is a magnified end view of the thermocouple having a single outer alignment feature of FIG. 8G

In yet a further embodiment, as illustrated in FIGS. 8G-8H, the thermocouple 50 includes a single outer alignment feature 70 formed into the sheath 54 adjacent to the measuring tip 52. The illustrated outer alignment feature 70 is formed as an indexing, or keying member 110. The keying member 110 corresponds to a similar shape in the recessed region 98 in the closed end 88 of the bore 40a of the susceptor ring 30. The keying member 110 can be integrally formed with the sheath 54, or the keying member 100 can be attached to the outer surface of the sheath 54 to form the outer alignment feature 70. In the illustrated embodiment, the outer diameter of the sheath 54 is reduced such that the keying member 110 that extends radially outward from the outer surface of the sheath 54 does not extend radially further than the outer diameter along the rest of the sheath 54.

Figure 8I:
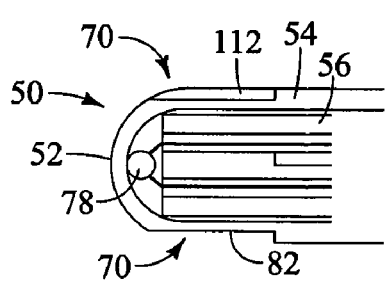
FIG. 8I is a magnified side view of an embodiment of a thermocouple having two outer alignment features.
Figure 8J:
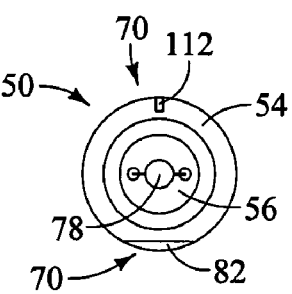
FIG. 8J is a magnified end view of the thermocouple having two outer alignment features of FIG. 8I.

In another embodiment, as illustrated in FIGS. 8I-8J, the thermocouple 50 includes two outer alignment features 70 formed into the sheath 54 adjacent to the measuring tip. In an embodiment, the outer alignment features 70 are formed as the same feature. In another embodiment, the outer alignment features 70 are formed as different features, as in the embodiment illustrated in FIGS. 8I-8J. It should be understood by one skilled in the art that when multiple outer alignment features 70 are formed into the sheath 54, the outer alignment features 70 can be formed as the same type of feature or the features can be formed of different types of features. In the illustrated embodiment, one of the outer alignment features 70 is formed as a cut-out 82 and the other of the outer alignment formed as an indexing member, or keyhole 112. The keyhole 112 is formed by removing a portion of the thickness of the sheath 54 at a localized position to form a recess into the sheath 54, wherein the keyhole 112 is configured to receive a protrusion (not shown) formed at the closed end 88 (FIGS. 2-3) of the bore 40a. It should be understood by one skilled in the art that the outer alignment feature 70 can be any feature or combination of features formed into or onto the sheath 54 to provide a cross-sectional shape at or near the measuring tip 52 of the sheath 54 that is different from the cross-sectional shape of the sheath 54 immediately adjacent thereto such that the outer alignment feature(s) 70 are configured to consistently positively locate the junction(s) 78 of the thermocouple 50 within the bore 40a of the susceptor ring 30 into which the thermocouple is inserted.

Figures 9, 10:
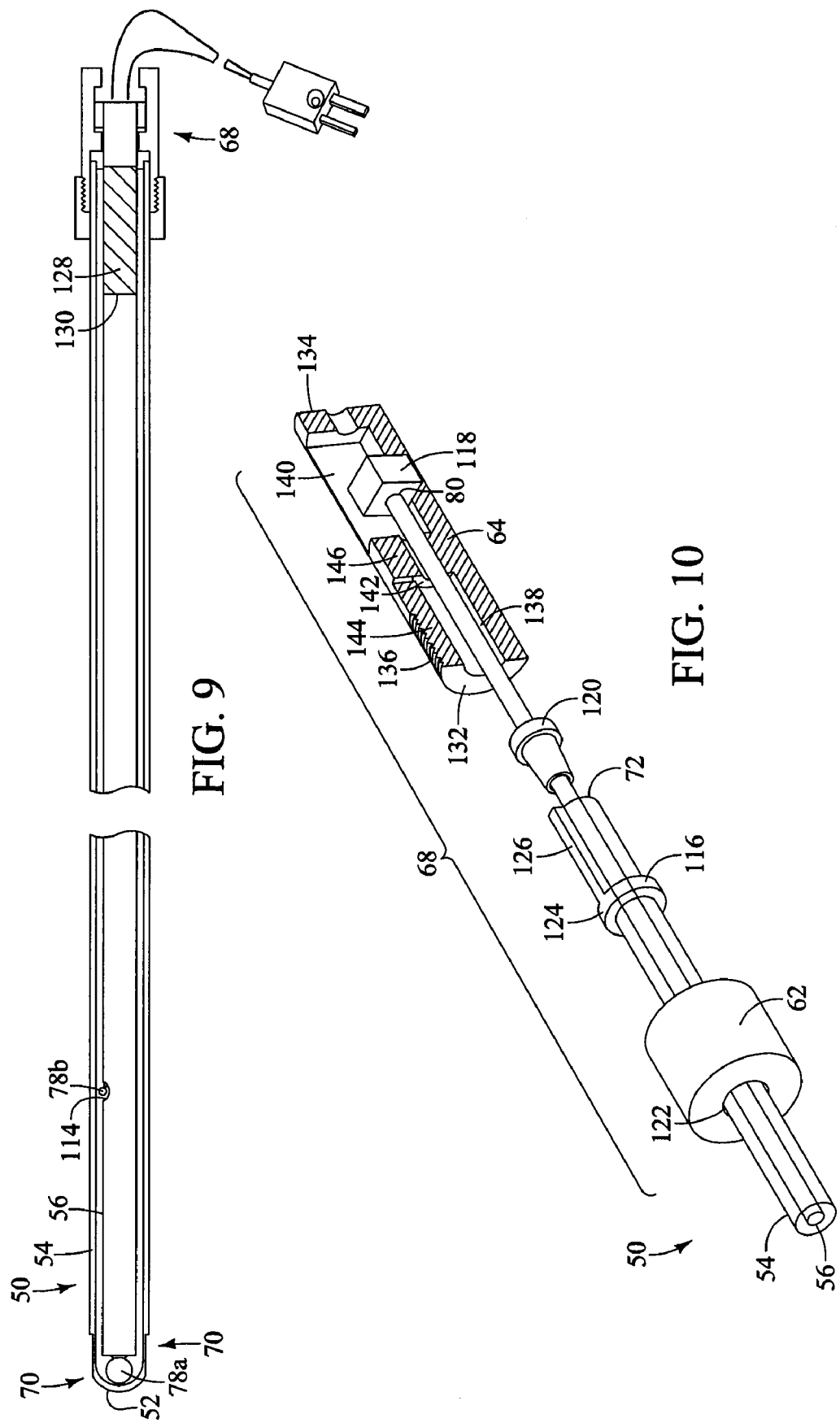
FIG. 9 is a side cross-sectional view of another embodiment of a thermocouple.
FIG. 10 is an exploded view of an embodiment of an inner alignment feature of the thermocouple of FIG. 9.

In an embodiment, the thermocouple 50 includes an inner alignment feature 68 configured to positively located at least one junction 78 of the thermocouple within the sheath 54 to optimize the location accuracy of the thermocouple 50. In an exemplary embodiment of a bi-junction thermocouple 50, as shown in FIG. 9, the thermocouple 50 includes two junctions 78, wherein the first junction 78a is formed at the first distal end of the support member 56 and located at the measuring tip 52 and the second junction 78b is formed at a position along the length of the support member 56 and spaced apart from the first junction 78a. The second junction 78b is located within a detent 114 formed into the support member 56 at a position between the first distal end 76 and the second distal end 80 of the support member 56. Because the second junction 78b is located at a position offset from the centerline of the support member 56, the location of the second junction 78b when installed within the susceptor ring 30 can affect the accuracy of the temperature measured by the second junction 78b. For example, if the thermocouple 50 is disposed within the bore 40a such that the second junction 78b is directed away from the aperture 44 and substrate 34 (FIGS. 1-2), the temperature measured is less accurate than if the thermocouple 50 is disposed within the bore 40a such that the second junction 78b is directed toward the aperture 44 and the substrate 34. The inner alignment feature 68 of the thermocouple 68 is configured to ensure proper alignment of the junction(s) 78a, 78b relative to the sheath 54 such that junctions 78a, 78b are positively located at pre-determine positions within the bore 40*a* when the thermocouple 50 is installed in the bore 40*a*.

In an embodiment, as illustrated in FIG. 10, the inner alignment feature 68 includes a nut 62, a cap 64, a first positioning member 116, a second positioning member 118, and a collar 120. The nut 62 is a cylindrical member having an aperture 122 formed through the longitudinal centerline thereof. The aperture 122 is configured to receive and surround the sheath 54. The nut 62 is configured to be removably attached to the cap 64. In an embodiment, the cap 64 is configured to receive the opening 72 of the sheath 54.

The collar 120 is configured to receive the support member 56 therein and be located adjacent to the opening 72 of the sheath 54, as illustrated in FIGS. 9-10. When assembled, the collar 120 is configured to contact an end of the spring 128, wherein the opposing end of the spring 128 contacts a second collar 130 operatively attached to the support member 56 spaced apart from the collar 120. The collar 120 provides a substantially fixed base from which the spring 128 extends. The spring 128 is configured to provide a biasing force onto the second collar 130, thereby biasing the support member 56 toward the measuring tip 52 of the sheath 54. The support member 56 is biased toward the measuring tip 52 to ensure proper positioning of the first junction 78*a* at the measuring tip 52. The support member 56 is allowed to freely thermally expand and contract longitudinally through the collar 120. The collar 120 is configured to be fitted between the opening 72 of the sheath 54 and the cap 64.

In an embodiment, the first positioning member 116 is operatively connected to the outer surface of the sheath 54, as illustrated in FIGS. 9-10. In an embodiment, the first positioning member 116 is integrally formed with the sheath 54. In another embodiment, the first positioning member 116 is formed separately from the sheath 54 and securely attached to the sheath 54. In an embodiment, the first positioning member 116 is formed of the same material as the sheath 54. In another embodiment, the first positioning member 116 is formed of a different material than the sheath 54. The first positioning member 116 includes a ring 124 and a stop member 126 extending from the ring 124. In an embodiment, the ring 124 is a cylindrical ring having an aperture formed along the longitudinal centerline of thereof. The aperture in the ring 124 is configured to surround and contact the outer surface of the sheath 54. It should be understood by one skilled in the art that the ring 124 can be formed of any shape with an aperture configured to receive the sheath 54. The outer diameter of the ring 124 is larger than the outer diameter of the sheath 54 such that the ring 124 extends radially outward from the outer surface of the sheath 54.

In an embodiment, the stop member 126 extends longitudinally rearward from the ring 124 toward the opening 72 of the sheath 54, as illustrated in FIGS. 9-10. The stop member 126 is an elongated, substantially linear member extending radially outward from the outer surface of the sheath 54. In an embodiment, the stop member 126 extends from the ring 124 to the rear edge of the sheath 54 forming the opening 72. In another embodiment, the stop member 126 extends only a portion of the distance between the ring 124 and the rear edge of the sheath 54. In an embodiment, the stop member 126 extends radially outward from the outer surface of the sheath 54 the same distance as the ring 124. In another embodiment, the stop member 126 extends radially outward from the outer surface of the sheath 54 either a greater or lesser distance as the ring 124. When assembled, the nut 62 completely surrounds at least a portion of the first positioning member 116.

In an embodiment, the second positioning member 118 is operatively connected to the second distal end 80 of the support member 56, as illustrated in FIGS. 9-10. The second positioning member 118 is configured to translate along the longitudinal centerline of the support member 56 in a corresponding manner as the support member 56 thermally expands and contracts in the longitudinal direction. In an embodiment, the second positioning member 118 is formed separately from the support member 56 and later operatively connected thereto. In another embodiment, the second positioning member 118 is integrally formed with the support member 56. In an embodiment, the second positioning member 118 and the support member 56 are formed of the same material. In another embodiment, the second positioning member 118 and the support member 56 are formed of different materials. The second positioning member 118 is configured to be received within the cap 64.

In an embodiment, the cap 64 is an elongated, generally cylindrical member having a first end 132 and an opposing second end 134, as shown in FIGS. 9-10. The cap 64 includes threads 136 formed on the outer surface adjacent to the first end 132. The threads 136 correspond to a threaded inner surface (not shown) of the nut 62 to threadingly attach the nut 62 and cap 64. It should be understood by one skilled in the art that the cap 64 can be formed as any shape sufficient to assist in positively locating the junction(s) 78 of the thermocouple 50 while being attachable to the nut 62. It should also be understood by one skilled in the art that the nut 62 and cap 64 can be attached by any other attachment mechanism. The cap 64 includes a first recessed region 138 and a second recessed region 140, wherein the first and second recessed regions 138, 140 are spaced apart from each other. In an embodiment, the first recessed region 138 is formed as an elongated bore along a portion of the longitudinal length of the cap 64. The first recessed region 138 extends longitudinally inwardly from the first end 132 of the cap 64. The first recessed region 138 includes a stop surface 142 that defines the longitudinal end of the first recessed region 138. The cap 64 further includes a slot 144 formed through the radial thickness of the cap 64 and extending from the first end 132 in a longitudinal manner. The slot 144 extends radially inwardly from the outer surface of the cap 64 to the outer surface of the first recessed region 138. The slot 144 is configured to receive the stop member 126 of the first positioning member 116 when the thermocouple 50 is assembled. The shape of the slot 144 substantially corresponds to the shape of the stop member 126 such that when the stop member 126 is received within the slot 144, the first positioning member 116 is prevented from rotating relative to the cap 64. Because the first positioning member 116 remains substantially rotationally fixed relative to the cap 64, the sheath 54 likewise remains substantially rotationally fixed relative to the cap 64 as due to the first positioning member 116 being fixedly connected to the sheath 54.

In an embodiment, the first recessed region 138 is separated from the second recessed region 140 by a web 146, as illustrated in FIG. 10. The second recessed region 140 extends radially inward from the outer surface of the cap 64. The second recessed region 140 is configured to receive the second distal end 80 of the support member 56 and the second positioning member 118 attached thereto. The cross-sectional shape of the second recessed region 140 corresponds to the cross-sectional shape of the second positioning member 118 received therein. For example, if the second positioning member 118 is formed as a cube having a substantially square cross-sectional shape, the second recessed region 140 is formed with a generally similar square cross-sectional shape that may be elongated radially outward to the outer surface of the cap 64. The cross-sectional shape of the second recessed region 140 corresponds to the cross-sectional shape of the second positioning member 118 to prevent rotation of the support member 56 relative to the cap 64 when assembled. The second recessed region 140 is configured to prevent rotation of the second positioning member 118 while allowing the second positioning member 118 and the support member 56 to thermally expand or contract longitudinally. Accordingly, the longitudinal length of the second recessed region 140 is sufficient to ensure the support member 56 and the second positioning member 118 are allowed to freely thermally expand and contract in the longitudinal manner without the second positioning member 118 contacting either longitudinal end of the second recessed region 140.

When the thermocouple 50 is assembled, as illustrated in FIGS. 9-10, the support member 56 including the first and second junctions 78a, 78b is inserted into the sheath 54 until the first junction 78a is positioned at the inner surface of the sheath 54 at the measuring tip 52 thereof. The collar 120 is disposed about the outer surface of the support member 56 and positioned within the opening 72 of the sheath 54. The measuring tip 52 of the sheath 54 is slid through the aperture 122 of the nut 62, and the nut 62 is slid along the length of the sheath 54 until the ring 124 of the first positioning member 116 contacts an end surface (not shown) of the bore in the nut 62. The cap 64 is positioned about the support member 56 such that the second positioning member 118 is located within the second recessed region 140 and the stop member 126 of the first positioning member 116 is received within the slot 144 of the cap 64 until the collar 120 contacts the stop surface 142 of the first recessed region 138 of the cap 64. The nut 62 is threadingly attached to the cap 64, thereby securing the sheath 54 and the support member 56 together. As the nut 62 is tightened about the cap 64, the collar 120 translates along the support member 56 toward the first distal end 76 thereof, thereby causing the spring 128 and the junction 78 to be positively located against the inner surface of the sheath 54 at the measuring tip 52.

The inner alignment feature 68, as shown in FIGS. 9-10, is configured to positively position the junctions 78a, 78b within the sheath 54 of the thermocouple 50 to provide for positive positioning and alignment of the junctions 78a, 78b within the bore 40a of the susceptor ring 30. In the illustrated embodiment, the second junction 78b is positioned in the detent 114 formed into the outer surface of the support member 56, thereby causing the second junction 78b to be offset relative to the longitudinal centerline of the support member 56. In the illustrated embodiment, when the support member 56 is inserted into the sheath 54 during assembly, the support member 56 is rotated such that the detent 114 and the second junction 78b are substantially longitudinally aligned with the stop member 126 of the first positioning member 116. In another embodiment (not shown), when the support member 56 is inserted into the sheath 54 during assembly, the support member 56 is rotated such that the detent 114 and the second junction 78b are oriented at 180 degrees relative to each other such that the second junction 78b is directed radially outward from the longitudinal centerline of the thermocouple in the opposite direction from which the stop member 126 extends radially outwardly from the outer surface of the sheath 54. It should be understood by one skilled in the art that the stop member 126 of the first positioning member 116 can be oriented in any manner relative to the second junction 78b. When the thermocouple 50 is assembled, the abutting relationship between the stop member 126 and the first positioning member 116 prevents the cap 64 from rotating relative to the sheath 54. Further, because the cap 64 is prevented from rotating relative to the sheath 54, the support member 56 is likewise prevented from rotating relative to the sheath 54 due to the abutting relationship between the outer radial surfaces of the second positioning member 118 and the second recessed region 140 of the cap 64. Because the support member 56 is prevented from rotating relative to the sheath 54, the second junction 78b remains substantially fixed in a predetermined position relative to the sheath 54. The inner alignment feature 68 therefore positively locates the second junction 78b relative to the stop member 126. As such, an operator installing a thermocouple 50 incorporating the inner alignment feature 68 into a bore 40a of a susceptor ring 30 can positively locate the junctions 78a, 78b within the bore 40a when knowing the fixed alignment of the second junction 78b relative to the stop member 126. In an embodiment, the cap 64 may further include a mark formed on the second end 134 to indicate the position of the second junction 78b relative to the sheath 54 for further assistance in positively locating the second junction 78b within the blind-hole bore 40a.

In an embodiment, a thermocouple 50 may include only an inner alignment feature 68, only at least one outer alignment features 70, or a combination of inner and outer alignment features 68, 70 to positively locate one or more junctions 78 within a bore 40 of a susceptor ring 30. For example, for a bi-junction thermocouple 50 (FIG. 9), the thermocouple 50 includes at least one outer alignment feature 70 to positively locate the first junction 78a within the recessed region 98 at the closed end 88 of the bore 40 of the susceptor ring 30. The illustrated thermocouple 50 further includes an inner alignment feature 68 to positively locate second junction 78b relative to the sheath 54 such that the operator knows the orientation and position of the second junction 78b relative to the inner alignment feature 68. It should be understood by one skilled in the art that the inner alignment feature 68 may be pre-aligned relative to the outer alignment feature(s) 70 as the outer alignment feature 70 may prevent rotation of the sheath 54 relative to the bore 40.

While preferred embodiments of the present invention have been described, it should be understood that the present invention is not so limited and modifications may be made without departing from the present invention. The scope of the present invention is defined by the appended claims, and all devices, process, and methods that come within the meaning of the claims, either literally or by equivalence, are intended to be embraced therein.

What is claimed is:

1. A thermocouple for temperature measurement within a bore of a susceptor ring, said thermocouple comprising:
    a sheath having a measuring tip located at one end thereof and an opening located at an opposing end thereof;
    a support member disposed within said sheath;
    at least one thermocouple junction located within said sheath; and
    at least one of an outer alignment feature located adjacent to said measuring tip and an inner alignment feature located adjacent to said opening, wherein at least one of said outer alignment feature and said inner alignment feature are configured to positively locate or align said at least one thermocouple junction within said bore of said susceptor ring.

2. The thermocouple of claim 1, wherein the thermocouple includes an inner alignment feature, and wherein said inner alignment feature includes a nut, a cap, a first positioning member, and a second positioning member, wherein said cap is attachable to said nut.

3. The thermocouple of claim 2, wherein said first positioning member is fixedly connected to said sheath, and said first positioning member is receivable within a slot formed in said cap such that said first positioning member contacts said slot to prevent said sheath from rotating relative to said cap.

4. The thermocouple of claim 2, wherein said second positioning member is fixedly connected to an end of said support member, said second positioning member being locatable within a recessed region formed in said cap, and said second positioning member contacts said recessed region to prevent said support member from rotating relative to said cap.

5. The thermocouple of claim 1, wherein the thermocouple includes an inner alignment feature, and wherein said inner alignment feature is configured to rotationally align said at least one thermocouple junction within said sheath.

6. The thermocouple of claim 1, wherein the thermocouple includes an outer alignment feature, and wherein said outer alignment feature is configured to translationally align said at least one thermocouple junction within said bore.

7. The thermocouple of claim 1, wherein the thermocouple includes an outer alignment feature, wherein said sheath includes a first cross-sectional shape and said outer alignment feature forms a second cross-sectional shape on said sheath that is different than said first cross-sectional shape.

8. The thermocouple of claim 7, wherein said outer alignment feature is receivable within a recessed region at an end of said bore, and dimensions of said outer alignment feature positively positions said at least one thermocouple junction longitudinally within said bore.

9. A system for measuring temperature within a semiconductor processing reactor, said system comprising:
 a susceptor ring having at least one bore formed therein, wherein said bore includes a closed end and forms a first cross-sectional shape;
 a recessed region formed at said closed end, wherein said recessed region forms a second cross-sectional shape within said bore, and said second cross-sectional shape is different than said first cross-sectional shape;
 a thermocouple disposable within said bore, said thermocouple comprising:
  a sheath having a measuring tip located at one end thereof and an opening located at an opposing end thereof;
  at least one thermocouple junction located within said sheath; and
  at least one of an outer alignment feature located adjacent to said measuring tip and an inner alignment feature located adjacent to said opening, wherein at least one of said outer alignment feature and said inner alignment feature are configured to positively locate or align said at least one thermocouple junction within said bore of said susceptor ring.

10. The system of claim 9, wherein the recessed region is defined by at least one longitudinal surface, an end surface adjacent to said longitudinal surface, and a transverse surface.

11. The system of claim 10, wherein the thermocouple includes an outer alignment feature, and wherein said outer alignment feature comprises a cut-out that forms a locating surface and a stop surface.

12. The system of claim 11, wherein said thermocouple is inserted into said bore such that said measuring tip is receivable within said recessed region when said locating surface and said at least one longitudinal surface are aligned until said stop surface contacts said end surface, thereby positively locating said at least one thermocouple junction longitudinally within said bore.

13. The system of claim 9, wherein the thermocouple includes an inner alignment feature, and wherein said inner alignment feature includes a nut, a cap, a first positioning member, and a second positioning member, and said cap is releasably attachable to said nut.

14. The system of claim 13, wherein said first positioning member prevents rotation of said sheath relative to said cap.

15. The system of claim 14, wherein said second positioning member prevents rotation of said at least one thermocouple junction relative to said cap such that said inner alignment feature positively aligns said at least one thermocouple junction rotationally within said bore.

\* \* \* \* \*